United States Patent
Rosenquist

(10) Patent No.: US 6,419,438 B1
(45) Date of Patent: Jul. 16, 2002

(54) FIMS INTERFACE WITHOUT ALIGNMENT PINS

(75) Inventor: Frederick T. Rosenquist, Redwood City, CA (US)

(73) Assignee: Asyst Technologies, Inc., Fremont, CA (US)

(*) Notice: Subject to any disclaimer, the term of this patent is extended or adjusted under 35 U.S.C. 154(b) by 0 days.

(21) Appl. No.: 09/723,629

(22) Filed: Nov. 28, 2000

(51) Int. Cl.$^7$ .............................................. B65G 49/07
(52) U.S. Cl. ..................... 414/217; 414/217.1; 414/805; 414/939
(58) Field of Search ............................. 414/217, 217.1, 414/805, 939

(56) References Cited

U.S. PATENT DOCUMENTS

| | | | |
|---|---|---|---|
| 4,532,970 A | 8/1985 | Tullis et al. | 141/98 |
| 4,534,389 A | 8/1985 | Tullis | 141/98 |
| 4,995,430 A | 2/1991 | Bonora et al. | 141/98 |
| 5,772,386 A | 6/1998 | Mages et al. | 414/411 |
| 6,013,920 A | 1/2000 | F | |
| 6,063,196 A * | 5/2000 | Li et al. | 118/712 |
| 6,186,331 B1 * | 2/2001 | Kinpara et al. | 206/711 |

FOREIGN PATENT DOCUMENTS

| | | |
|---|---|---|
| WO | 09/130254 | 8/1998 |
| WO | WO 99/52140 | 10/1999 |
| WO | 09/115414 | 10/2000 |

OTHER PUBLICATIONS

"SMIF: A Technology for Wafer Cassette Transfer in VLSI Manufacturing," Mihir Parikh and Ulrich Kaempf, *Solid State Technology*, Jul. 1984, pp. 111–115.

* cited by examiner

Primary Examiner—Steven A. Bratlie
(74) Attorney, Agent, or Firm—O'Melveny & Myers LLP

(57) ABSTRACT

A front opening interface mechanical standard, or "FIMS", system is disclosed for ensuring proper registration of a pod door against a port door on a load port assembly without the use of guide pins on the port door. In a preferred embodiment, the load port assembly includes kinematic pins provided to mate within slots on the bottom of a FOUP to provide a fixed and repeatable position of the FOUP on the load port assembly. The load port assembly further includes a pair of latch keys protruding outwardly from the outer surface of the port door for mating within slots of a door latch assembly within the pod door. The load port assembly may further include vacuum seals on the port door, or magnetic assemblies, to further facilitate support of the pod door on the port door. In one embodiment, with the above constraints, the load port assembly may initially include removable alignment pins. The alignment pins operate in conjunction with a calibration fixture to set the respective and collective heights of the kinematic pins on the load port assembly. Once the kinematic pins are adjusted so that the vertical plate is parallel to the port door and the openings in the vertical plate mate cleanly over the removable alignment pins, the calibration fixture may be removed and the alignment pins may be removed from or retracted back into the port door. Thereafter, a FOUP may be placed on the pod advance plate and advanced to the port door.

24 Claims, 10 Drawing Sheets

FIMS INTERFACE WITHOUT ALIGNMENT PINS

CROSS REFERENCE TO RELATED APPLICATION

The present application is related to the following applications, which applications are assigned to the owner of the present invention and which applications are incorporated by reference herein in their entirety:

U.S. patent application Ser. No. 09/115,414, entitled, "POD DOOR TO PORT DOOR RETENTION SYSTEM", which application is currently pending; and U.S. patent application Ser. No. 09/130,254, entitled, "POD TO PORT DOOR RETENTION AND EVACUATION SYSTEM", which application is currently pending.

BACKGROUND OF THE INVENTION

1. Field of the Invention

The present invention relates to the transfer of workpieces such as semiconductor wafers from a storage and transport pod to a process tool, and in particular to a system for ensuring proper registration of the pod door against the port door on the load port assembly without the use of guide pins on the port door.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, scaled pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles and molecular contaminants become of interest.

SMIF pods are in general comprised of a pod door which mates with a pod shell to provide a sealed environment in which wafers may be stored and transferred. So called "bottom opening" pods are known, where the pod door is horizontally provided at the bottom of the pod, and the wafers arc supported in a cassette which is in turn supported on the pod door. It is also known to provide front opening pods referred to as front opening unified pods, or FOUPs, in which the pod door is located in a vertical plane, and the wafers are supported either in a cassette mounted within the pod shell, or to shelves mounted in the pod shell.

In order to transfer wafers between a FOUP and a process tool within a wafer fab, the FOUP is typically loaded either manually or automatedly onto a pod advance plate, which then advances the FOUP toward the process tool. The process tool includes an access port which, in the absence of a pod, is covered by a port door. Upon advance of the FOUP toward the process tool, the pod door aligns against the port door.

Once the pod is positioned on the load port, mechanisms within the port door unlatch the pod door from the pod shell and move the pod door and port door together into the process tool where the doors are then stowed away from the wafer transfer path. The pod shell remains in proximity to the interface port so as to maintain a clean environment including the interior of the process tool and the pod shell around the wafers. A wafer handling robot within the process tool may thereafter access particular wafers supported in the pod for transfer between the pod and the process tool.

The load port includes several mechanisms for ensuring that the pod and port doors properly align along the X (horizontal) and Z (vertical) axes so as to properly mate with each other. For example, the pod advance plate includes three kinematic pins that mate within respective slots on the bottom of the FOUP to ensure a precise and repeatable seating of the pod on the load port. Additionally, the port door includes a pair of latch keys, which latch keys fit within slots within the front surface of the pod door. It is the latch keys which rotate to unlatch the pod door from the pod shell and at the same time latch the pod door to the port door. The port door further includes a pair of guide pins which mate within holes in the front surface of the pod door. It is further known to provide a vacuum source around the guide pins to hold the pod door against the port door. A prior art system including the above features is disclosed in U.S. Pat. No. 5,772,386, entitled "Loading and Unloading Station for Semiconductor Processing Installations", which patent is assigned to Jenoptik A. G. Such a system is shown in FIG. 1. As seen therein, there is a pair of latch keys 10, a pair of guide pins 12 and a pair of suction cups 14 surrounding the guide pins, each for positioning the pod on the load port assembly.

The above-described mechanisms for positioning the pod with respect to the port door assembly amount to an over-constraint of the FOUP on the load port. This over-constraint has at least two significant drawbacks. First, by providing additional alignment or guiding mechanisms, this provides additional sources for particulates when the pod door is transferred to and from the port door. As indicated above, the geometries of the devices formed on semiconductor wafers are so small today that particulates of even extremely small sizes can adversely effect or ruin a device geometry on the wafer. A second drawback of over-constraint results from the fact that FOUPs occasionally deform or are improperly constructed, and tilt slightly (i.e., 10 to 30 mils) to the side while supported on the kinematic pins. When the FOUP door is aligned over the guide pins, the pins force the pod into a straightened position on the load port. This can generate particulates. Additionally, when the door is removed, the pod shell may return to its unrestrained tilted position. Thus, the FOUP door may not properly align with the FOUP shell upon return of the door to the shell. This misalignment may result in the generation of particulates, or may prevent the door from being properly returned to the shell entirely. It may also happen that FOUP sits properly on the kinematic pins, but the pod door is misaligned within the pod shell. In this event, when the pod door seats over the guide pins, particulates can be generated.

SUMMARY OF THE INVENTION

It is therefore an advantage of the present invention to provide a load port assembly that does not include excessive constraints for positioning a FOUP on the load port assembly.

It is another advantage of the present invention to minimize the amount of particulates and contaminants that may otherwise be generated as a result of contact between the pod door and guide pins.

It is a further advantage of the present invention to allow the pod door to be returned to the pod in substantially the same position from which is was acquired.

These and other advantages are provided by the present invention, which in preferred embodiments relates to a front opening interface mechanical standard, or "FIMS" system for ensuring proper registration of a pod door against a port door on a load port assembly without the use of guide pins on the port door. In a preferred embodiment, the load port assembly includes registration features such as kinematic pins provided to mate within slots on the bottom of a FOUP to provide a fixed and repeatable position of the FOUP on the load port assembly. The load port assembly further includes a pair of latch keys protruding outwardly from the outer surface of the port door. The latch keys are provided to mate within slots of a door latch assembly within the pod door. Once the latch keys are properly seated within the slots, the latch keys are rotated by mechanisms within the port door to decouple the pod door from the pod shell. Such rotation at the same time couples the pod door to the port door. The load port assembly may further include vacuum seals on the port door, or magnetic assemblies, to further facilitate support of the pod door on the port door. The vacuum seals or magnetic assemblies are preferably activated prior to unlocking the pod door from the shell.

With the provision of the above pod constraints on the port door, the guide pins conventionally provided on the port door may be omitted. Omission of the guide pins removes the possibility that particulates and contaminants will be generated as a result of contact between the pod door and guide pins. Additionally, without the guide pins to alter the position of the pod, there is no interference between the pod door and shell upon return of the door to the shell. Moreover, the pod door is returned to the same relative position within the pod shell from which it was acquired.

In one embodiment, the load port assembly may initially include removable alignment pins. The alignment pins operate in conjunction with a calibration fixture to set the respective and collective heights of the kinematic pins on the load port assembly. In particular, the calibration fixture includes a horizontal plate seated on the kinematic pins and a vertical plate including holes that fit over the removable pins in the port door. Once the kinematic pins are adjusted so that the vertical plate is parallel to the port door and the openings in the vertical plate mate cleanly over the removable alignment pins, the calibration fixture may be removed and the alignment pins may be removed from or retracted back into the port door. Thereafter, a FOUP may be placed on the pod advance plate and advanced to the port door.

BRIEF DESCRIPTION OF THE DRAWINGS

The present invention will now be described with reference to the figures, in which:

FIG. 2A is an alternative latch key configuration to that shown in FIG. 2 including rollers;

DETAILED DESCRIPTION

The present invention will now be described with reference to FIGS. 2–10 which in preferred embodiments relate in general to a FIMS system for loading containers such as FOUPs into a process tool. While a preferred embodiment of the present invention operates in conjunction with a SMIF pod, it is understood that the present invention may operate with any of various containers. Additionally, the present invention may operate with containers carrying any of various workpieces, including wafers, reticles, and flat panel displays.

Figure 1:
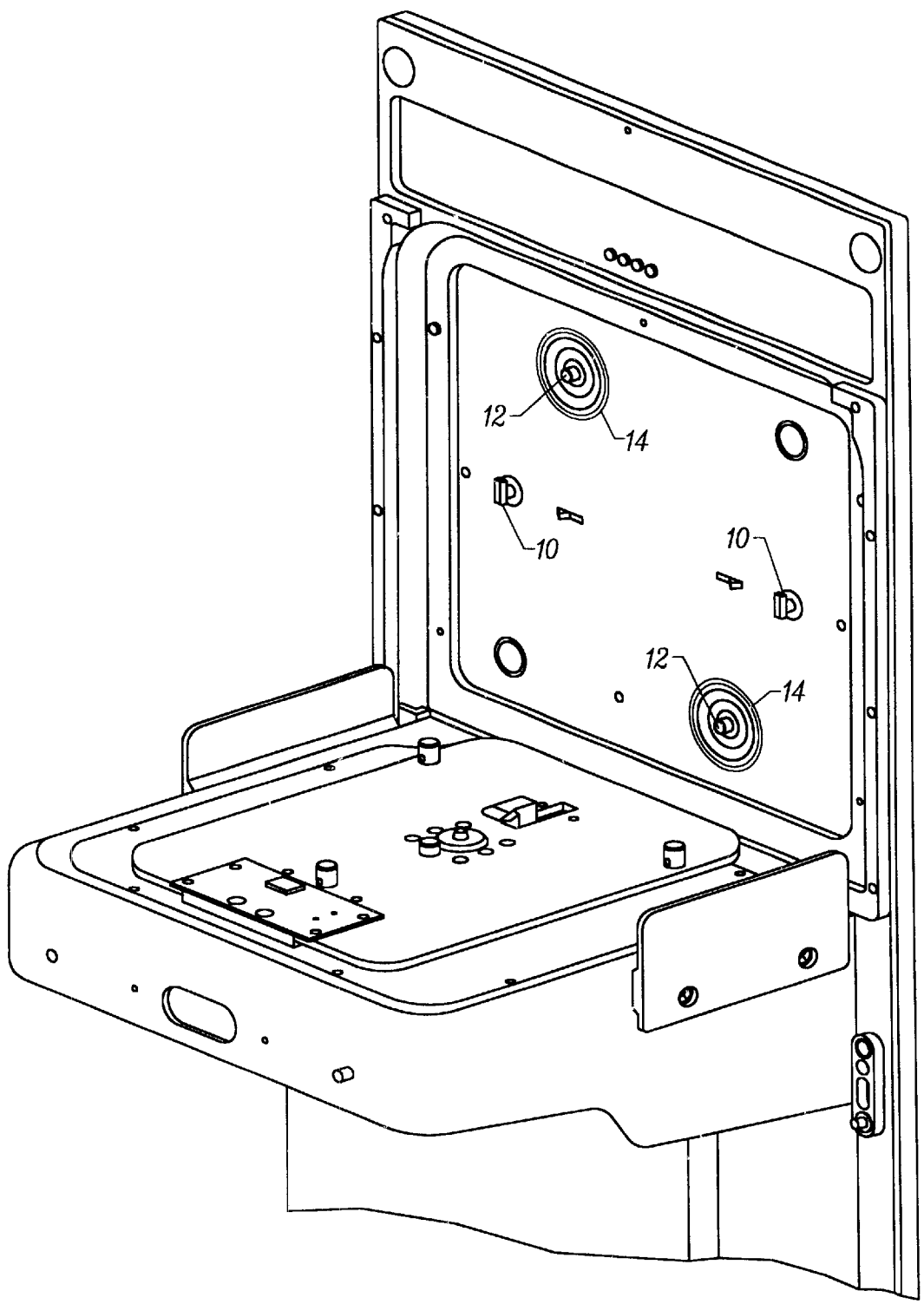
FIG. 1 is a perspective view of a prior art load port assembly.
Figure 2:
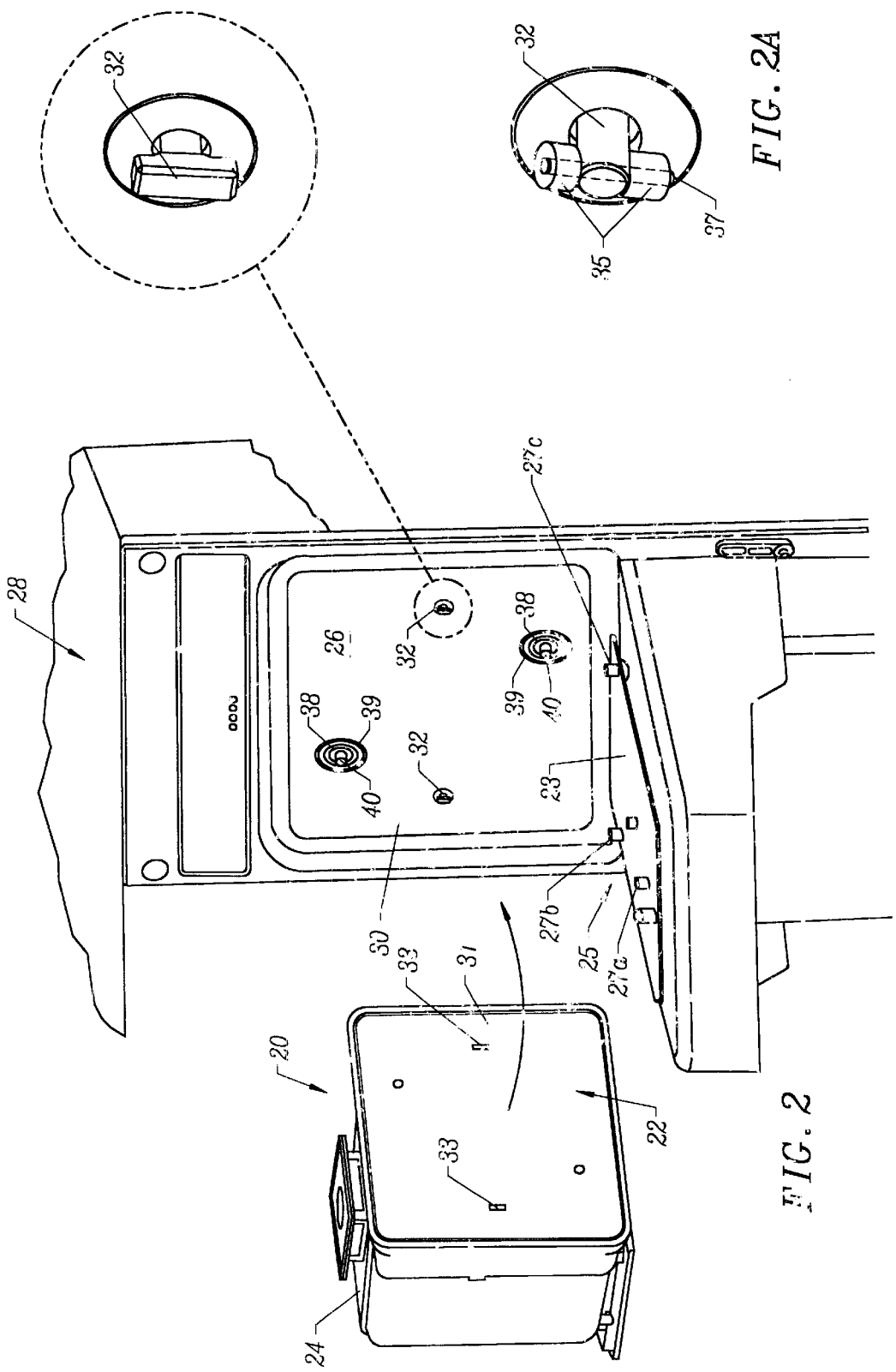
FIG. 2 is a perspective view of FOUP and a load port assembly according to the present invention.
Figure 3:
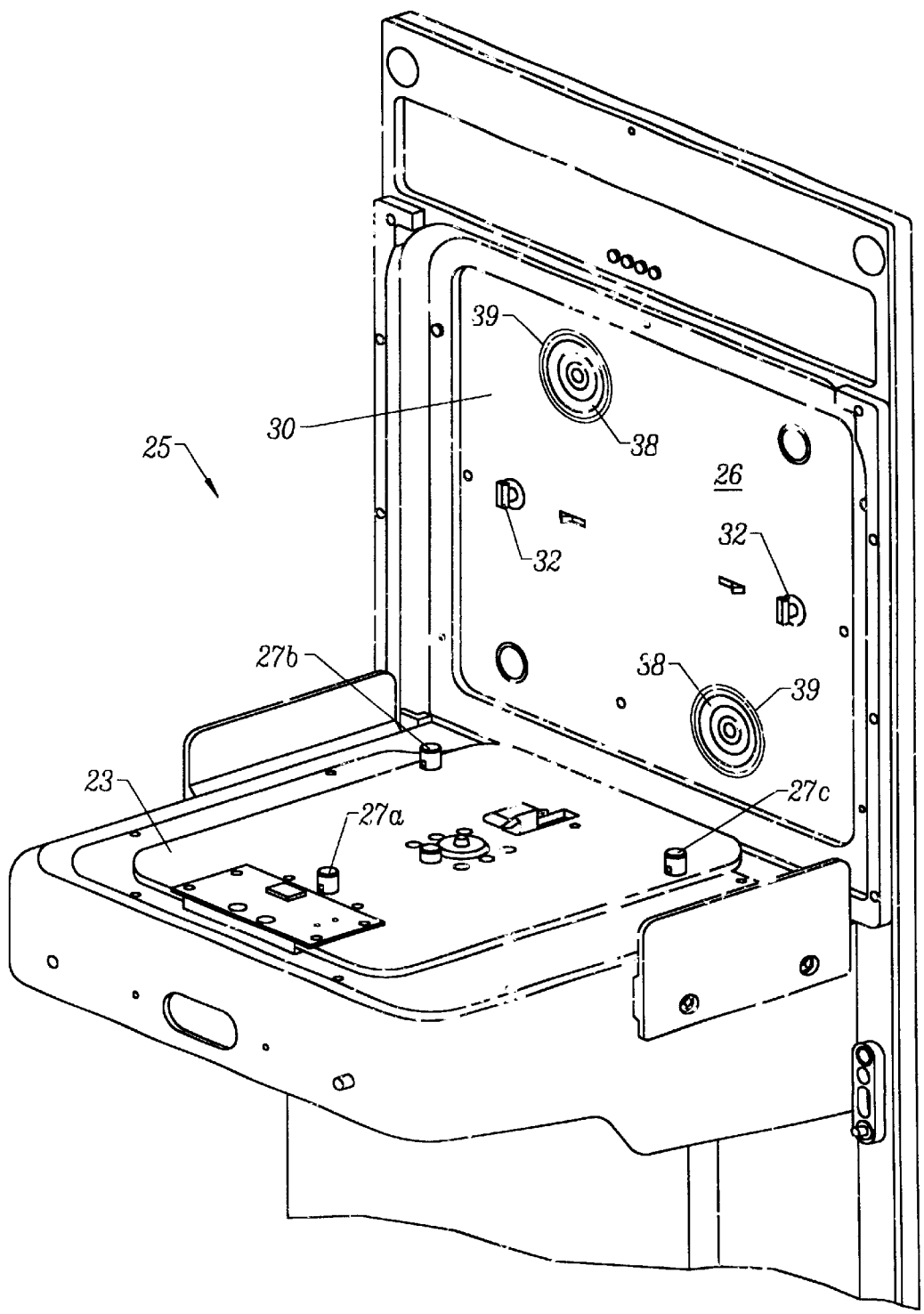
FIG. 3 is perspective view of the load port assembly according to the present invention.

Referring now to FIG. 2, there is shown a perspective view of a 300 mm FOUP 20 including a pod door 22 mating with a pod shell 24 to define a sealed environment for one or more workpieces located therein. (The front of the pod door 20 would ordinarily be facing the front of the port door as the pod is loaded on the port. It is shown otherwise in FIG. 2 for clarity). FIGS. 2 and 3 additionally show a load port assembly 25 according to the present invention. In order to transfer the workpieces between the pod 20 and a process tool 28, the pod is loaded onto a pod advance plate 23 on load port assembly 25, which is affixed to or is part of the process tool. Once the presence of a FOUP on advance plate 23 is sensed, a linear drive beneath advance plate 23 may drive the plate and the FOUP toward a port door 26. The type of process carried out within tool 28 is not critical to the present invention, and maybe any of various testing, monitoring, and/or processing operations.

Advance plate 23 includes three kinematic pins 27a, 27b and 27c. As indicated in the Background of the Invention section, the kinematic pins 27 are provided to mate within slots (not shown) on the bottom of the FOUP 20 to provide a fixed and repeatable position of the FOUP on the load port assembly 25. As explained hereinafter, the height of each of the kinematic pins 27 is independently adjustable in the advance plate to allow adjustment of the height of a FOUP on the pins along the Z axis, adjustment of the roll about a Y axis (i.e. an axis perpendicular to the plane of the port door, and adjustment of the roll about the X axis (i.e., an axis perpendicular to the Y and Z axes).

Referring now to FIGS. 2 and 3, a front surface 30 of the port door 26 faces a front surface 31 of the pod door 22, and includes a pair of latch keys 32 for being received in a corresponding pair of slots 33 of a door latching assembly mounted within pod door 22. An example of a door latch assembly within a pod door adapted to receive and operate with latch key 32 is disclosed in U.S. Pat. No. 4,995,430 entitled "Sealable Transportable Container Having Improved Latch Mechanism", to Bonora et al., which patent is assigned to the owner of the present invention, and which patent is incorporated by reference herein in its entirety. In order to latch the pod door to the port door, the pod door 22 is seated adjacent the port door 26 so that the vertically oriented latch keys are received within the vertically oriented slots 33.

In addition to decoupling the pod door from the pod shell, rotation of the latch keys 32 will also lock the keys onto their respective slots 33, thus coupling the pod door to the port door. An alternative latch key 32 is shown in FIG. 2A including rollers 35 mounted on a pin 37 of the key. Details relating to alternative latch key 32 are disclosed in greater detail in U.S. patent application Ser. No. 09/115,414 previously incorporated by reference. A preferred embodiment of the present invention includes two latch key 32 and slot 33 pairs, each of which pairs are structurally and operationally identical to each other.

While a preferred embodiment of the door latch assembly in the pod door has been described above, it is understood that the above-described mechanisms in the pod door for coupling/uncoupling the pod door to the pod shell are not critical to the present invention and may vary significantly in alternative embodiments.

In a preferred embodiment of the present invention, as shown in FIGS. 2 and 3, the port door 26 may further include a pair of suction seals 38 for engaging the pod door and holding the pod door tightly against the port door. A hole is provided through the port door, central to the suction seals 38, for communicating a negative pressure from a remote vacuum source, through the port door, to the suction seals. The seals 38 are preferably formed of an elastomer. In a preferred embodiment, once the pod door is brought into contact with the pod door and prior to removing the pod door from the shell, the low pressure from the vacuum source is activated to hold the pod door against the port door. Although not preferable, the vacuum source may be activated after the pod door is removed from the shell in alternative embodiments.

Instead of or in addition to the vacuum seals 38, in addition to decoupling the pod door from the shell and coupling the pod door to the port door, the latch keys 32 may also pull the pod door tightly against the port door. Details relating to latch keys which perform this function are disclosed in greater detail in U.S. patent application Ser. No. 09/115,414 previously incorporated by reference.

In addition to the suction seals, an elastomeric O-ring 39 may also be provided radially outward from the suction seals. The O-rings 39 are mounted to the port door and extend a slight distance in front of the port door to add friction between the port and pod doors upon contact to prevent relative movement between the doors. Instead of having the suction seals define a relatively small area, the seal may alternatively be provided along the perimeter of the port door. Details relating to such a design are disclosed in U.S. patent application Ser. No. 09/130,254, previously incorporated by reference.

In addition to the suction seals and vacuum source described above, additional vacuum ports may be provided at and/or around the latch keys 32. The vacuum ports are connected to a vacuum source providing a separate low pressure than that communicated to the suction seals. These vacuum ports are provided for collecting particles that may be generated at the latch keys.

Figure 4:
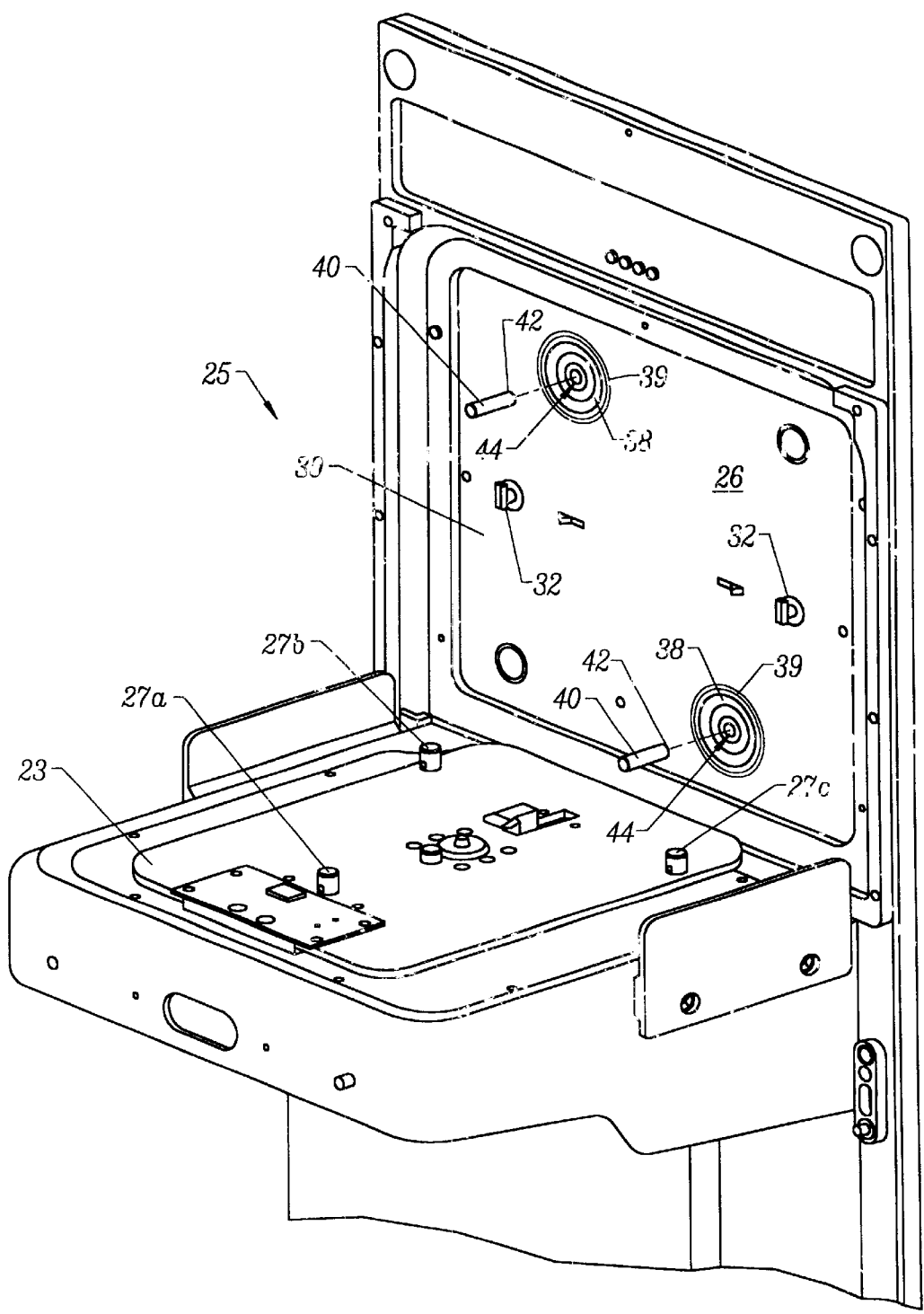
FIG. 4 is perspective view of the load port assembly according to the present invention showing the removable alignment pins.

Referring now to FIGS. 2 through 4, in one embodiment of the present invention, the load port 25 further includes a pair of removable alignment pins 40 protruding past the front surface of the port door. The alignment pins 40 are preferably cylindrical with a tapered end, and are preferably formed of stainless steel. The pins preferably have a diameter of 0.354 inches and extend past the front surface of the port door 0.433 inches when properly positioned extending from the port door. It is understood that these dimensions may vary in alternative embodiments. While two such pins 40 are shown, it is understood that there may be one pin or greater than two pins in alternative embodiments. Moreover, it is understood that the positions of the pins may vary on the port door in alternative embodiments.

The pins 40 may be removably affixed to the front surface of the port door by a variety of known conventions. In one such embodiment, the two pins 40 may each have a threaded base 42 which mate within holes 44 threaded partially through the port door. The length of the threads on the pins and/or the depth of the holes in the port door may be controlled so that once the pins are rotated as much as possible, the pins protrude from the port door precisely the desired distance. The pins 40 may alternatively or additionally include a flange (not shown) which rests against a surface of the port door and defines a definite stop when the pins are fully screwed into position. The threads may have a fine or course pitch.

In a further alternative embodiment, instead of unscrewing from the port door, the pins and port door may be threaded so that the pins retract into the port door upon rotating the pins.

Figure 5:
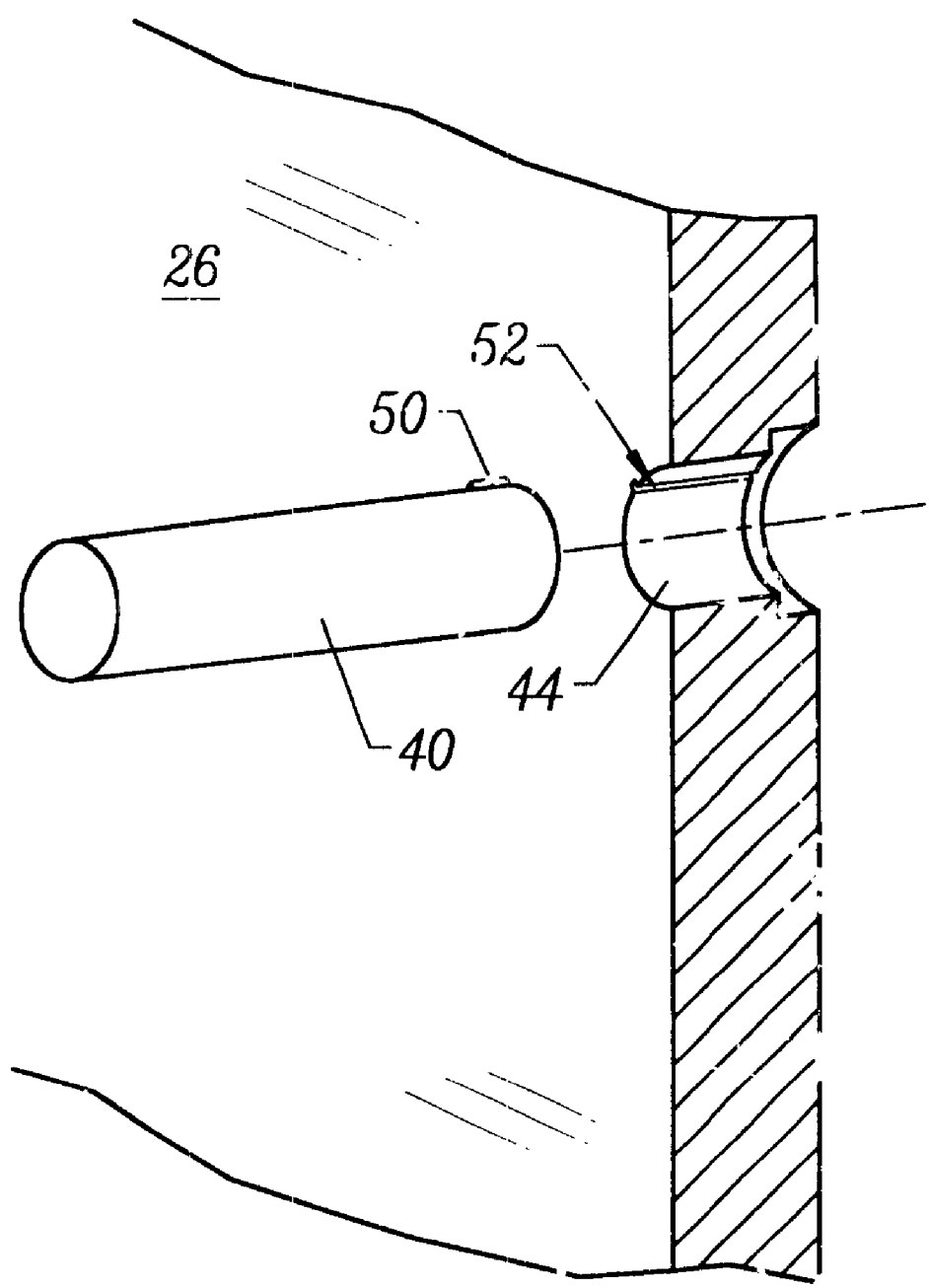
FIG. 5 is a perspective view of a removable pin configuration according to an alternative embodiment of the invention.

In an alternative embodiment shown in FIG. 5, instead of having threads, the pins can be slip fit into the holes 44 in a bayonet-type coupling. In this embodiment, the pins may include a small protrusion 50 which mates within a small slot 52 tangentially provided in the pin holes 44. The back of the hole 44 has a slightly wider diameter than the rest of the hole, i.e., at least as wide as the pin 40 and protrusion 50 together. Thus to mount the pin 40 in hole 44, the pin is inserted straight into the hole with the protrusion aligned with the slot and rotated when the pin has reached its rearmost position. The pins may alternatively be slip fit into the holes 44 without the bayonet-type mounting.

Figure 6:
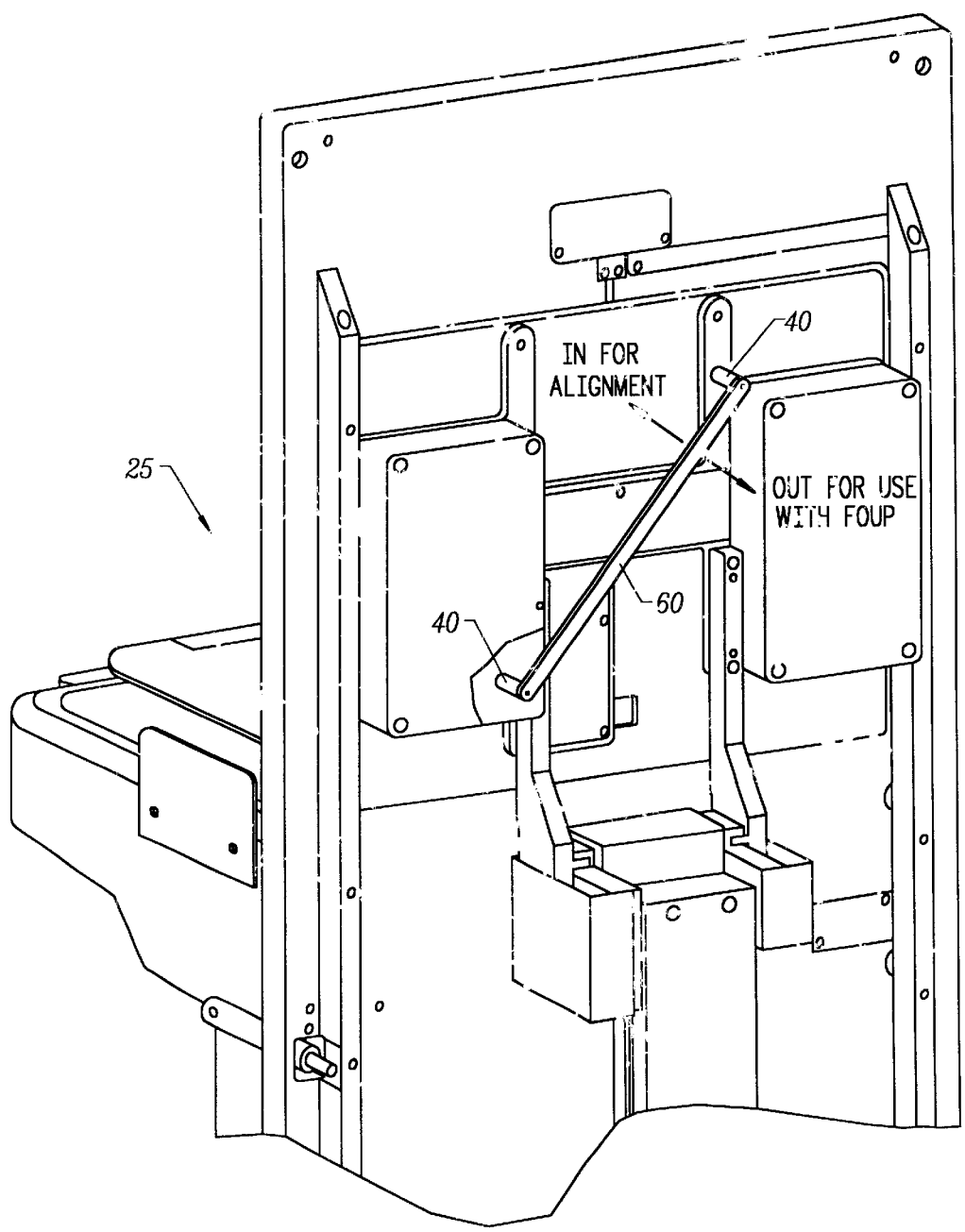
FIG. 6 is a perspective view of a further alternative embodiment for moving the alignment pins between their extended and retracted positions.
Figure 7:
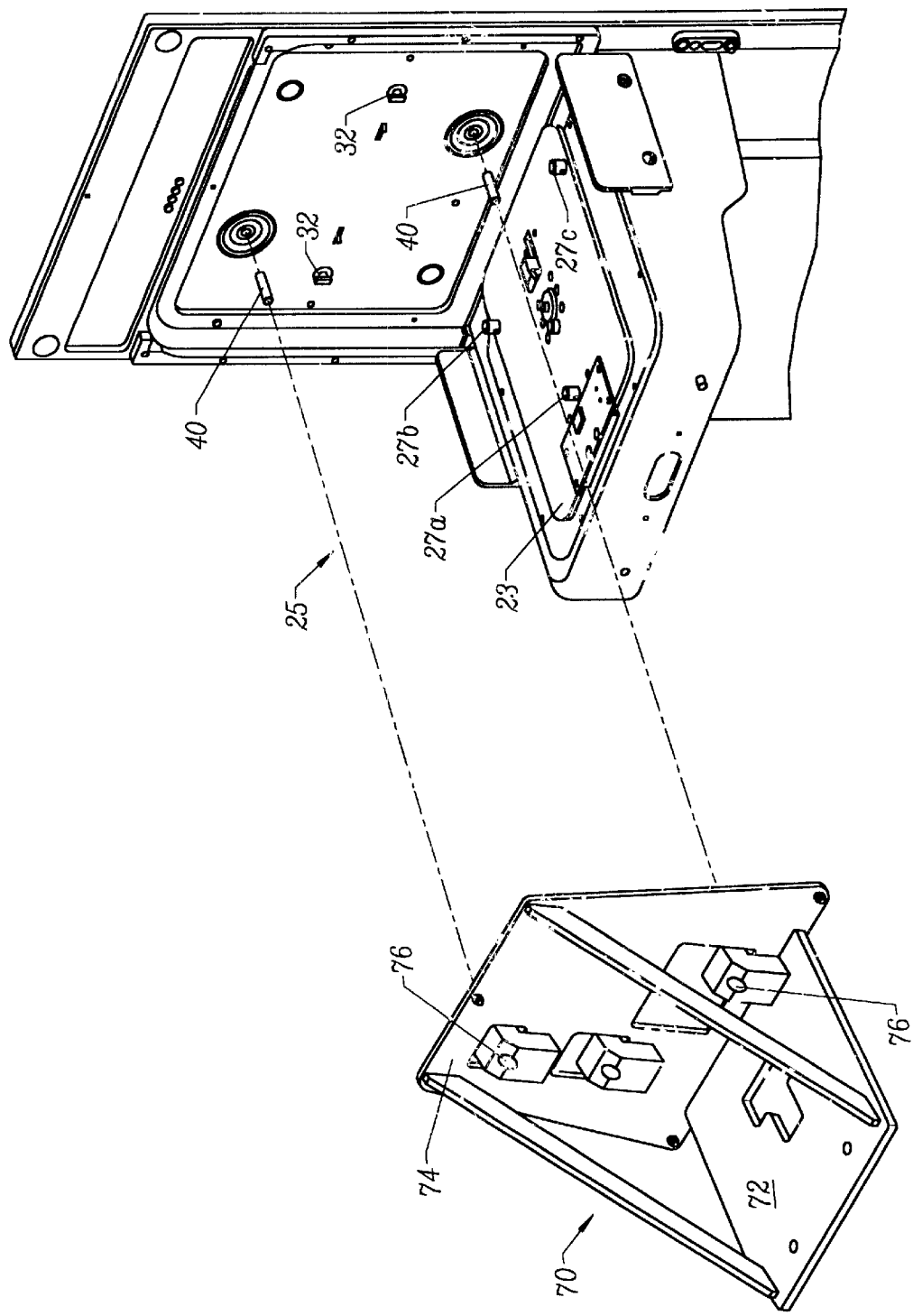
FIG. 7 is a perspective view of a calibration fixture seated on the load port assembly according to the present invention.
Figure 8:
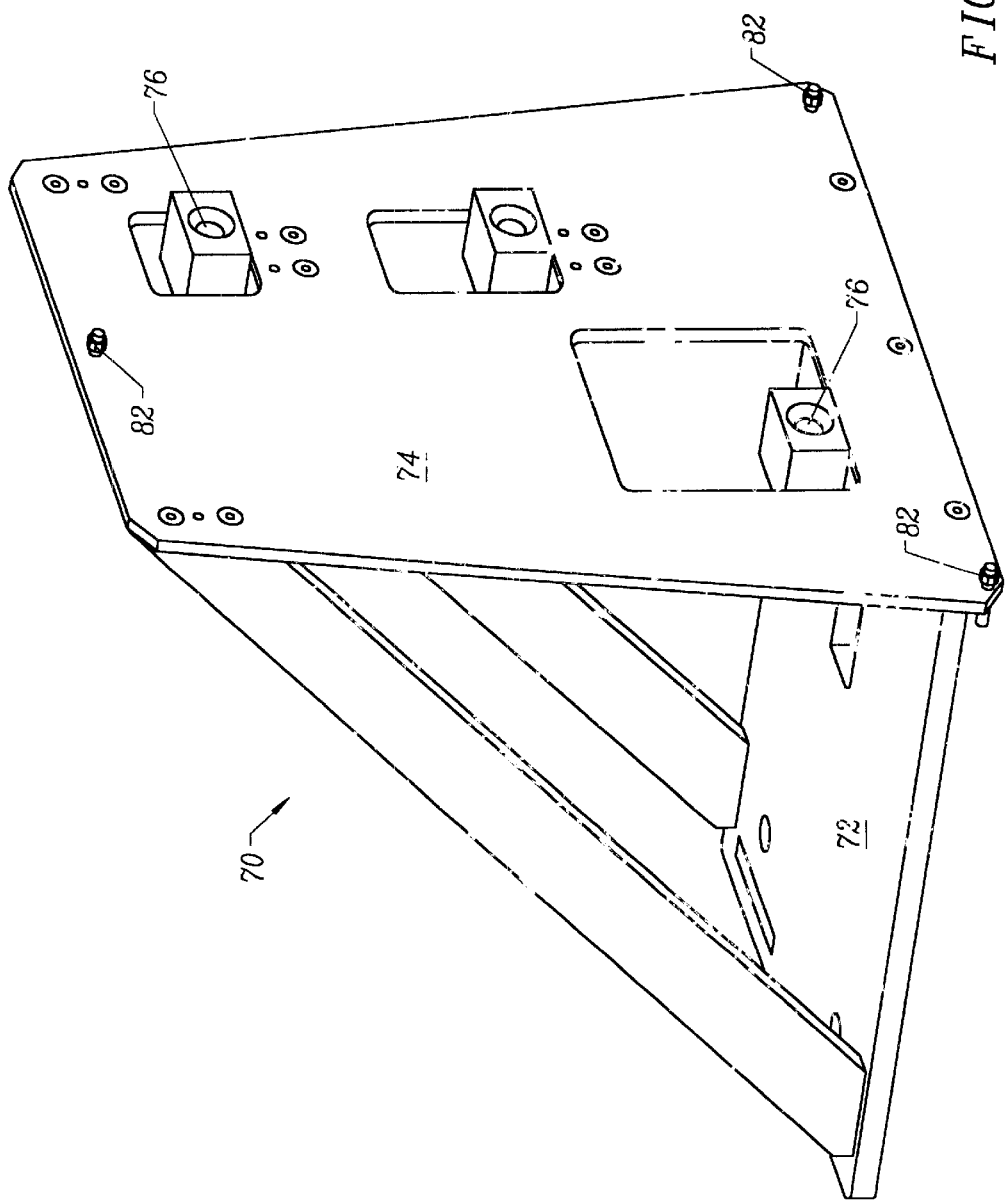
FIG. 8 is another view of the calibration fixture according to the present invention.
Figure 9:
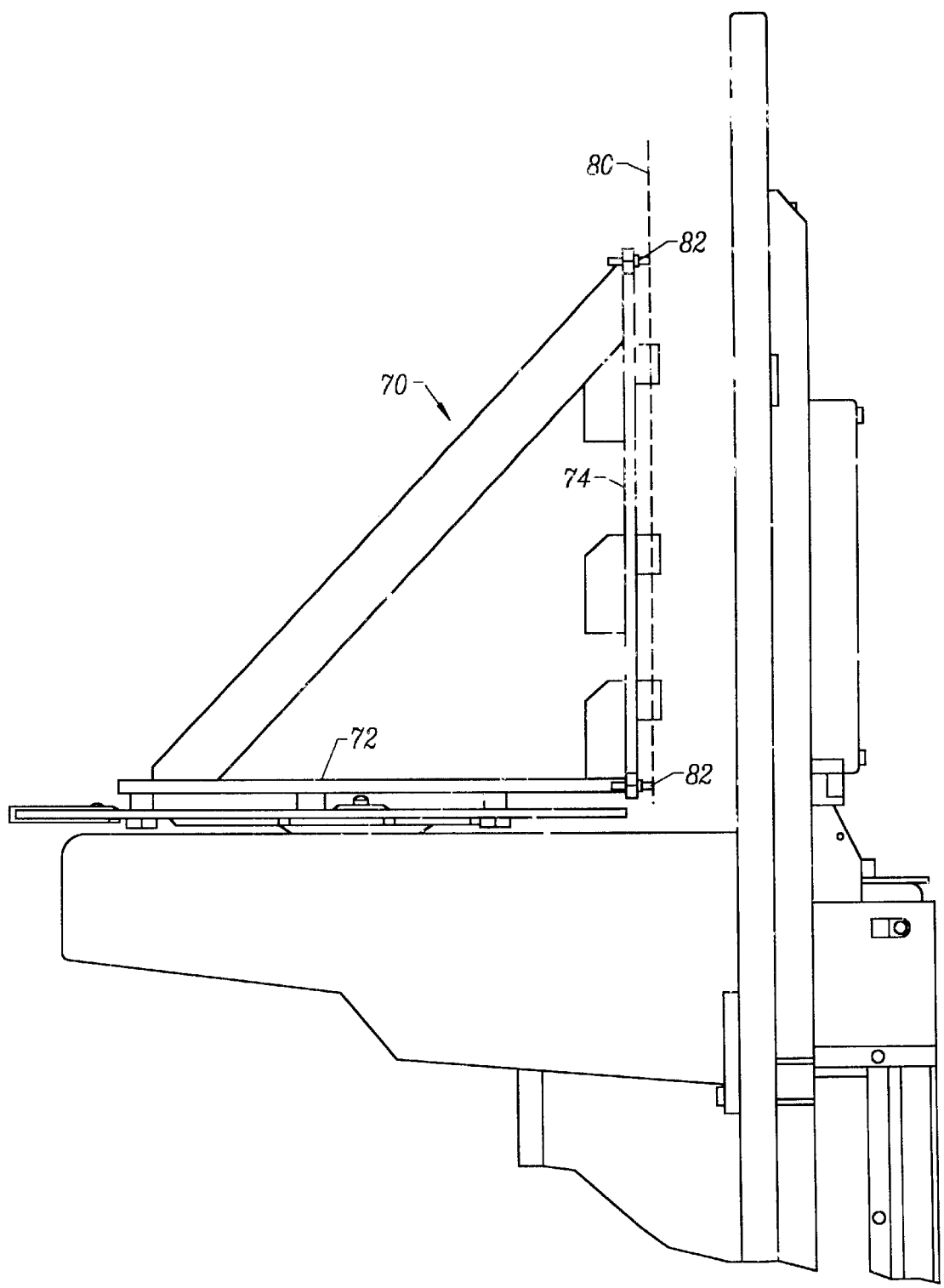
FIG. 9 is a side view of the calibration fixture according to the present invention spaced away from the load port.
Figure 10:
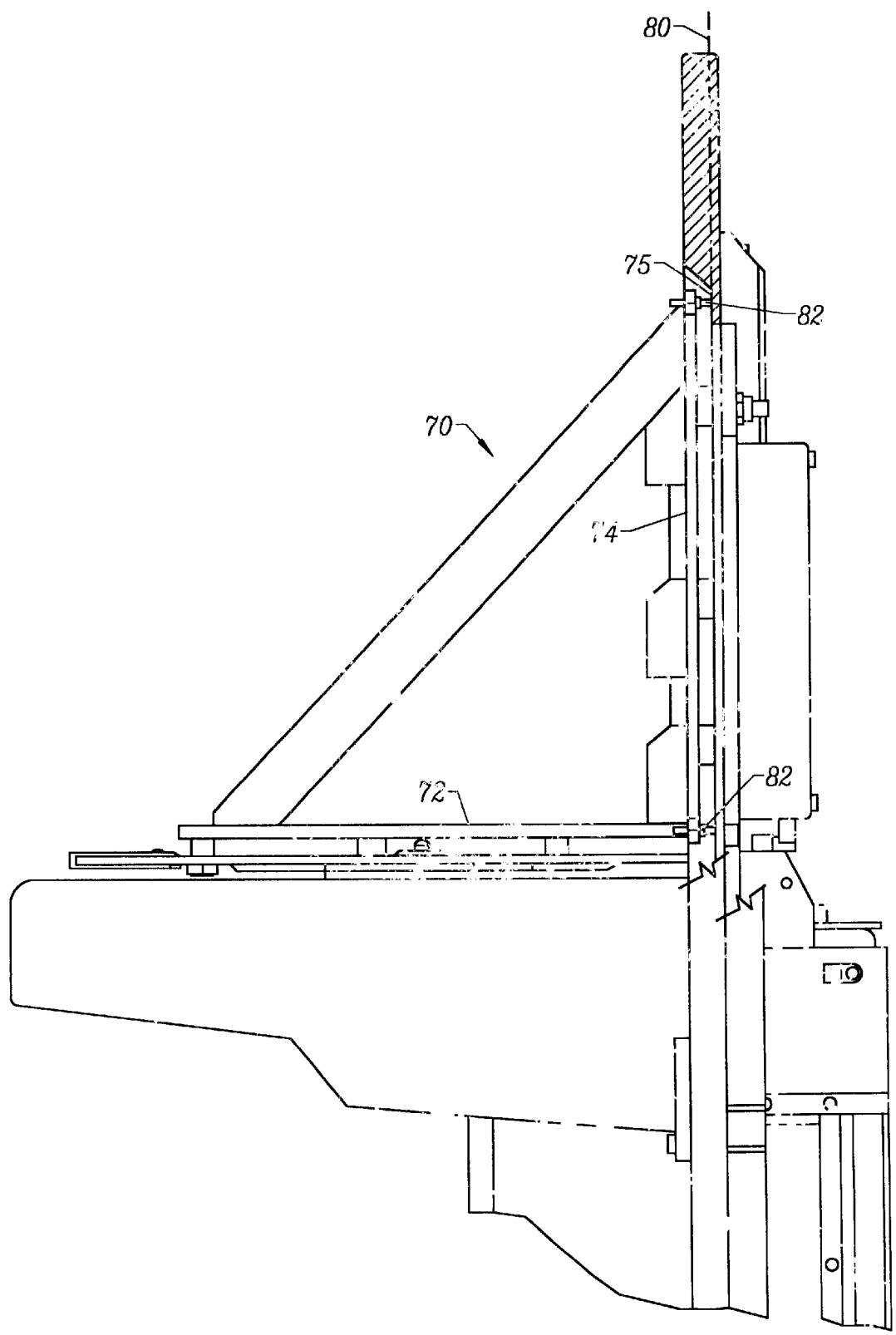
FIG. 10 is a side view of the calibration fixture according to the present invention adjacent the load port.

Referring to FIG. 6, the pins may alternatively be inserted into holes 44 from the back of the port door. In this embodiment, the holes 44 extend completely through the port door. The pins in this embodiment may be mounted at their back ends to a member 60 extending across the rear of the port door. The member 60 may be moved between a first position where the pins extend through a front surface of the port door and a second position where the pins are retracted so as not to extend past the front surface of the port door. The member 60 may be moved between the first and second positions by a solenoid or other automated mechanism (not shown). Alternatively, for example where the load port may be moved away from the process tool, the member 60 may be moved between the first and second positions manually.

In the embodiment of FIG. 6, the pins may have a length such that, even in their retracted positions, the pins do not fully retract out of holes 44. This prevents particulates from behind the port door from entering into the interface between the port and pod doors. In alternative embodiments, the pins may retract fully out of holes 44. This embodiment has the advantage that both pins may be quickly and easily extended or retracted together.

In a further alternative embodiment, the pins may include two or more concentric sections that allow the alignment pins 40 to extend and retract telescopically in a known configuration. In the extended position, the pins may extend the precisely desired distance past the surface of the port door. In the retracted position, the pins are retracted into or substantially into the port door. In such an embodiment, the pins may be biased to their extended position as by a compressive spring through a hollow center of the concentric pin sections. The pins in this embodiment may further include a conventional internal ratchet assembly that allows the pins to be alternatively moved between their extended position for aligning, and their retracted position simply by pressing on the end of the pin. Such ratchet mechanisms are common in writing instruments including extending and retracting writing tips. As explained hereinafter, the alignment pins are used to configure the position of the kinematic pins prior to use with a FOUP, and once configured, the pins are removed or retracted so as not to extend past the front surface of the port door when the port is used with a FOUP. In this embodiment, the pins can be moved between their extended positions (for configuring the kinematic pins) and their retracted positions (for use with a FOUP) by manually pressing the pins inward.

In an embodiment including telescoping pin sections, it is also understood that the pin may be moved between the extended and retracted positions automatically. In this embodiment, a central rod may extend from the rear of the port door through the hollow center of the telescoping sections, and be affixed to the interior front portion of the pin. The rods may be automatically extended and retracted to automatically move the alignment pins 40 between their extended and retracted positions. For example, the rear portion of the rod may be threaded and engaged by any of various gear systems such as a rack and pinion system or worm gear system mounted in the rear of the port door. The gear system can in turn be actuated by a motor or solenoid controlled by a controller to move the pins 40 between their extended and retracted positions.

Referring now to FIGS. 7–10, with the pins properly positioned within the port door, the height of the kinematic pins with respect to the pod advance plate and with respect to each other may be calibrated by a calibration fixture 70 so that a FOUP subsequently placed on the kinematic pins will be properly aligned to the port door. The calibration fixture may consist of two perpendicular plates 72, 74 affixed to each other by welding or other known process. The bottom of the plate 72 includes counterbores or slots as in the bottom of the pod for resting on the kinematic pins. The vertical plate 74 is preferably larger than the port door so as to have outer edges capable of lying adjacent the port plate 75 (FIG. 10) surrounding the port door. The front surface of the vertical plate 74 includes openings 76 which are capable of mating over the alignment pins 40 and the latch keys 32 on the port door. It is understood that the shape of the calibration fixture may vary significantly with the provision that it include counterbores or slots on a horizontal surface and holes in a vertical surface, and that the slots and holes occupy the same relative positions as the slots and holes in a FOUP. As the latch keys are not intended to latch within any openings in the calibration fixture, the openings in the vertical plate 74 that fit over the latch keys 32 may be much larger than the latch keys themselves.

In general, a vertical reference plane 80 (FIGS. 9 and 10) may be defined by the vertical plate 74. In order to calibrate the kinematic pins, the calibration fixture is seated on the kinematic pins. The height of the kinematic pins are adjusted until the vertical reference plane 80 is in a desired planar relation to the port plate 75, and the holes 76 align over the alignment pins 40 in the port door.

The vertical reference plane may be defined by number of calibration features on the vertical plate 74. In a preferred embodiment, three calibration pins 82 may be provided at the outer edges of the vertical plate and extending from the surface of the vertical plate 74 in the direction of the port when the fixture 70 is on the load port 25. The ends of the three calibration pins 82 define the vertical reference plane 80. Alternatively, the calibration pins 82 may be omitted and the front surface of the vertical plate 74 itself may define the vertical reference plane.

The planarity of the vertical reference plane relative to the port, and the position of the openings 76 relative to alignment pins 40, may specifically be adjusted as follows. Prior to initially loading FOUPs onto the load port assembly, the calibration fixture is seated on the kinematic pins and advanced to the port door. The planarity or tilt of the vertical reference plane 80 about the X axis with respect to the port plate 75 maybe adjusted by adjusting the height of the kinematic pin 27a relative to kinematic pins 27b and 27c. In a preferred embodiment, the height of kinematic pin 27a is adjusted relative to kinematic pins 27b and 27c until the vertical reference plane is parallel to the port plate. This position of the vertical reference plane may be identified when each of the calibration pins 82 lie in contact with the port plate 75.

In a second calibration, the orientation of the vertical plate 74, i.e., the rotation of the vertical plate 74 about the Y axis, relative to the port door may be adjusted by raising or lowering one or both of the pins 27b and 27c. The height of the pins 27b and/or 27c are adjusted until the openings 76 on the vertical plate 74 align over alignment pins 40.

The second calibration must be performed in conjunction with a third calibration, where the height of the vertical plate 74 along the Z axis may be adjusted relative to that of the port door by adjusting the height of all three kinematic pins together. That is, the height of each kinematic pin is adjusted together until the openings 76 are at the correct height to mate directly over pins 40.

The height of the kinematic pins may be adjusted independently and in concert according to the above process until the vertical reference plane is parallel, or in some predefined position, to the port plate 75, and both openings 76 mate cleanly over alignment pins 40 on the port door. Once this process is completed, the kinematic pins are at the proper height to correctly, precisely and repeatedly position a FOUP on the kinematic pins to the load port. After the calibration process is completed, the calibration fixture 70 may be removed and the alignment pins 40 may be removed from or retracted back into the port door as described above. Thereafter, a FOUP may be placed on the pod advance plate and advanced to the port door. It is understood that the calibration process by calibration plate 70 maybe performed once when a load port is installed, periodically at the start of processing of workpieces on the load port, or always at the start of processing of workpieces on the load port.

In an alternative embodiment of the present invention, the above described process for calibrating the load port 25 may be completely automated. This embodiment may employ a calibration fixture 70 substantially as described above. However, in this embodiment, instead of having calibration pins 72 fixedly mounted in the vertical plate 74, the calibration pins may extend from the vertical plate but are capable of translation into and out of the vertical plate.

Each of the pins in this embodiment may be affixed at their back ends within the vertical plate 74 to a variable resistor of respective electrical circuits so that the pins comprise displacement sensors. That is, each of the electrical circuits are capable of identifying the respective distances by which each of the pins extends past the front surface of the calibration plate.

The calibration pins are situated at the outer edges of the vertical plate 74 as described above, such that when the calibration fixture is seated on the load port, the calibration pins contact the port plate 75. The three calibration pins are forced backward into the vertical plate 74 as a result of contact with the port plate by differing degrees, depending on the planarity of the vertical reference plane 80 relative to the port plate 75. Based on the position of each of the calibration pins, the controller can then determine the planarity of the vertical plate 74 relative to the port.

The height and orientation about the Y axis of the calibration plate relative to the port can also be automatically determined according to this embodiment by a number of known schemes. In one embodiment, a pair of tapered gimballing pins may be mounted in the vertical plate 74, which pins are positioned to be received within holes 44 in the port door when the calibration fixture is properly aligned on the kinematic pins. The gimballing pins are capable of deflecting in any direction, which direction and magnitude may be identified by a circuit attached to the calibration pins (an analogous circuit would be those associated with conventional joysticks used for computer applications). One such circuit may comprise a pair of variable resistors, one capable of detecting deflection of the pin along the X axis and a second capable of detecting deflection of the pin along the Z axis, with the two variable resistors together capable of detecting deflection at angles between the X and Z axes.

According to this embodiment, the calibration fixture may advance toward the port door so that the gimballing pins are received within holes 44. If the gimballing pins do not align squarely within the holes 44, the pins will deflect. Measurement of the direction and magnitude of the deflection of the two pins will result in the central processor determining the height and orientation about the Y axis of the vertical plate 74 relative to the port.

In an alternative embodiment for determining the height and orientation about the Y axis of the vertical plate 74 relative to the port, the port door preferably includes a pair of openings, or a pair of small areas having a different reflectance than the surrounding area. The vertical plate 74 in turn includes a pair optical sensors in the place of openings 76. Optical sensors may additionally or alternatively be placed behind the holes in the port door. By measuring the amount of light passing through or reflected off of the port door and received in the optical sensors, the height and orientation of the vertical plate to the port door may be determined.

In accordance with this embodiment, the kinematic pins may be mounted on independent drives of known construction, capable of rotating the pins to vary the height of the pins above the advance plate. It is understood that the kinematic pins may be controllably driven to different heights above the advance plate by other known mechanisms.

This automatic calibration system thus comprises a closed loop feedback system where the kinematic pin drives adjust the heights of the kinematic pins above the advance plate based on feedback received from the displacement sensor pins and the optical sensors. The kinematic pins are adjusted until the displacement sensor pins and optical sensors provide a predetermined reference feedback. This reference feedback corresponds to the correctly aligned position of the calibration plate, and the desired heights of the kinematic pins above the advance plate.

By omission of the guide pins, transfer of the pod door from the FOUP to the port door and back again takes place without any potential frictional contact between the front surface of the pod door and the guide pins. Moreover, without the guide pins, the position of the pod door when acquired is substantially maintained. Thus, the pod door may be returned to substantially the same position in the pod shell from which it was acquired.

As described above, the port door initially includes removable pins which align with holes in the calibration fixture to set the position of the kinematic pins. In an alternative embodiment, the pins in the port door may be omitted altogether, and the port door simply include one or more holes. In this embodiment, the calibration fixture includes one or more pins in positions which correspond with the positions of the holes in the port door. In this embodiment, the calibration fixture is loaded onto the load port assembly prior to FOUP transfer to the load port. In operation, the kinematic pins are adjusted until the pins in the calibration fixture fit cleanly within the holes in the port door. When this position of the kinematic pins is found, the load port assembly is ready for use with a FOUP.

With the omission of the guide pins in accordance with the present invention, it is understood that the pod door may be mounted to the port door by a variety of constraints. Suction seals 38 are described above. In a further alternative embodiment (not shown), it is contemplated that the port door include one or more magnets rotatably mounted in its front surface. The magnets align with a corresponding number of magnets on the front surface of the pod door. Upon loading of the pod onto the load port assembly, the N-S poles of the port magnets align with the S-N poles, respectively, of the pod magnets so that the pod door is attracted into firm engagement with the port door. The magnets in the port may be rotationally supported in the port so as to be able to rotate about the Y axis perpendicular to the surfaces of the port and pod doors. When the pod door is to be returned to the pod, the magnets are rotated 180° so that the N-S poles of the port magnets align with the N-S poles, respectively, of the pod magnets. In this position, juxtaposed magnets will repel each other, and the pod door may be returned to the pod. As would be appreciated by those of skill in the art, instead of having permanent magnets that rotate, the port door may include electromagnets and the pod door may have magnetic sections corresponding to the positions of the electromagnets. In this embodiment, the electromagnets may be energized to attract the pod door when the pod and port doors are to be coupled, and the electromagnets may be turned off to remove any attraction when the pod and port doors are to be separated.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

I claim:

1. An interface for receiving and opening a container housing one or more workpieces associated with a semiconductor fabrication process, the container including a shell and vertically oriented door, the interface including registration features for supporting the container, the vertically oriented door including at least one slot, the interface comprising:
    a vertical surface;
    at least one key protruding from said vertical surface capable of fitting within said at least one slot, said at least one key capable of opening the container and joining the vertically oriented door to said vertical surface;
    at least one hole provided within said vertical surface; and
    at least one removable alignment pin capable of fitting within said at least one hole, said at least one removable alignment pin being positioned in said at least one hole to adjust a position of said registration features, and said at least one removable pin being removed from said interface for receiving the container on the interface.

2. An interface as recited in claim 1, further comprising at least one vacuum source for generating a low pressure at said vertical surface.

3. An interface as recited in claim 2, further comprising at least one suction seal around said at least one hole, said low pressure being generated at said vertical surface through said at least one hole, said suction seal engaging the vertically oriented door to hold the vertically oriented door against said vertical surface.

4. An interface as recited in claim 3, further comprising at least one O-ring circumjacent about said at least one suction seal for generating a frictional contact between the vertically oriented door and said vertical surface.

5. An interface as recited in claim 2, further comprising at least one vacuum port at and/or around said at least one key for removing particulates from the interface.

6. An interface as recited in claim 1, wherein said at least one hole comprises two holes, and said at least one removable alignment pin comprises two removable alignment pin.

7. An interface as recited in claim 1, further comprising a magnet provided in said vertical surface for attracting and holding said vertically oriented door.

8. An interface as recited in claim 1, said at least one removable alignment pin being slip fit within said at least one hole.

9. An interface as recited in claim 1, said at least one removable alignment pin including threads for screw into said at least one hole.

10. A system for receiving and opening a container housing one or more workpieces associated with a semiconductor fabrication process, the container including a shell and vertically oriented door, the vertically oriented door including at least one slot, the system comprising:
    a horizontal surface including registration features for supporting the container;
    a vertical interface including a port door which may be opened to allow transfer of the one or more workpieces therethrough;
    at least one key protruding from said door capable of fitting within said at least one slot, said at least one key capable of opening the container and joining the vertically oriented door to said port door;
    at least one hole provided within said port door;
    at least one removable alignment pin capable of fitting within said at least one hole; and
    a calibration fixture including:
        a horizontal plate capable of seating on said registration features, and
        a vertical plate capable of aligning adjacent said vertical interface, said vertical plate including at least one alignment hole, adjustment of said registration features beneath said horizontal plate aligning said at least one alignment hole over said at least one alignment pin, said at least one alignment pin being removed after said at least one alignment hole is aligned over said at least one alignment pin.

11. A system as recited in claim 10, further comprising at least one vacuum source for generating a low pressure at said vertical surface.

12. A system as recited in claim 11, further comprising at least one suction seal around said at least one hole, said low pressure being generated at said vertical surface through said at least one hole, said suction seal engaging the vertically oriented door to hold the vertically oriented door against said vertical surface.

13. A system as recited in claim 12, further comprising at least one O-ring circumjacent about said at least one suction seal for generating a frictional contact between the vertically oriented door and said port door.

14. A system as recited in claim 11, further comprising at least one vacuum port at and/or around said at least one key for removing particulates from the vertical interface.

15. A system as recited in claim 10, wherein said at least one hole comprises two holes, and said at least one removable alignment pin comprises two removable alignment pin.

16. A system as recited in claim 10, said at least one removable alignment pin being slip fit within said at least one hole.

17. A system as recited in claim 10, said at least one removable alignment pin including threads for screwing into said at least one hole.

18. A system for receiving and opening a container housing one or more workpieces associated with a semiconductor fabrication process, the container including a shell and vertically oriented door, the vertically oriented door including at least one slot, the system comprising:
    a vertical interface including registration features for supporting the container;
    at least one key protruding from said vertical interface capable of fitting within said at least one slot, said at least one key capable of opening the container and joining the vertically oriented door to said vertical interface;
    at least one hole provided within said vertical interface; and
    a calibration fixture including:
        a horizontal plate capable of seating on said registration features, and
        a vertical plate capable of aligning adjacent said interface, said vertical plate including at least one alignment hole and at least one alignment pin capable of fitting within said at least alignment one hole, adjustment of said registration features beneath said horizontal plate aligning said at least one alignment pin within said at least one hole in said interface.

19. A method of calibrating an interface for receiving and opening a container housing one or more workpieces associated with a semiconductor fabrication process, the container including a shell and vertically oriented door, the interface including registration features for supporting the container and a vertical surface, the method comprising the steps of:
  (a) seating one or more alignment pins through one or more holes in the vertical surface;
  (b) seating a calibration fixture on the registration features, the calibration fixture including one or more alignment holes;
  (c) adjusting a position of the registration features until the one or more alignment holes align with the one or more alignment pins; and
  (d) removing the one or more alignment pins from the vertical surface prior to seating the container on the interface.

20. A method of calibrating an interface for receiving and opening a container housing one or more workpieces associated with a semiconductor fabrication process as recited in claim 19, wherein said step (c) of adjusting a position of the registration features until the one or more alignment holes align with the one or more alignment pins is performed manually.

21. A method of calibrating an interface for receiving and opening a container housing one or more workpieces associated with a semiconductor fabrication process as recited in claim 19, wherein said step (c) of adjusting a position of the registration features until the one or more alignment holes align with the one or more alignment pins is performed automatedly.

22. A method of calibrating an interface for receiving and opening a container housing one or more workpieces associated with a semiconductor fabrication process, the container including a shell and vertically oriented door, the interface including a horizontal surface having registration features for supporting the container and a vertical surface having at least one alignment hole, the method comprising the steps of:
  (a) seating a calibration fixture on the registration features, the calibration fixture including at least one alignment pin; and
  (b) adjusting a position of the registration features until the at least one alignment pin aligns with the at least one alignment hole.

23. A method of calibrating an interface for receiving and opening a container housing one or more workpieces associated with a semiconductor fabrication process as recited in claim 22, wherein said step (b) of adjusting a position of the registration features until the one or more alignment holes align with the one or more alignment pins is performed manually.

24. A method of calibrating an interface for receiving and opening a container housing one or more workpieces associated with a semiconductor fabrication process as recited in claim 22, wherein said step (b) of adjusting a position of the registration features until the one or more alignment holes align with the one or more alignment pins is performed automatedly.

* * * * *